(12) United States Patent
Hayakawa et al.

(10) Patent No.: US 10,348,059 B2
(45) Date of Patent: Jul. 9, 2019

(54) LIGHT EMITTING ELEMENT ARRAY AND OPTICAL TRANSMISSION DEVICE

(71) Applicant: FUJI XEROX CO., LTD., Tokyo (JP)

(72) Inventors: Junichiro Hayakawa, Kanagawa (JP); Akemi Murakami, Kanagawa (JP); Takashi Kondo, Kanagawa (JP); Naoki Jogan, Kanagawa (JP); Jun Sakurai, Kanagawa (JP)

(73) Assignee: FUJI XEROX CO., LTD., Minato-ku, Tokyo (JP)

( * ) Notice: Subject to any disclaimer, the term of this patent is extended or adjusted under 35 U.S.C. 154(b) by 0 days.

(21) Appl. No.: 15/631,378

(22) Filed: Jun. 23, 2017

(65) Prior Publication Data

US 2018/0048125 A1    Feb. 15, 2018

(30) Foreign Application Priority Data

Aug. 10, 2016 (JP) .................. 2016-158002

(51) Int. Cl.
*H01S 5/42* (2006.01)
*H01S 5/042* (2006.01)
*H01S 5/022* (2006.01)
*H01S 5/183* (2006.01)
*H01S 5/00* (2006.01)
*G02F 1/01* (2006.01)
*G02B 6/42* (2006.01)
*G02B 6/38* (2006.01)

(52) U.S. Cl.
CPC ............ *H01S 5/423* (2013.01); *G02B 6/3885* (2013.01); *G02B 6/3897* (2013.01); *G02B 6/4206* (2013.01); *G02B 6/4262* (2013.01); *G02F 1/0115* (2013.01); *H01S 5/0085* (2013.01); *H01S 5/0425* (2013.01); *H01S 5/18313* (2013.01); *H01S 5/02284* (2013.01)

(58) Field of Classification Search
CPC ........................................... H01S 5/423
See application file for complete search history.

(56) References Cited

U.S. PATENT DOCUMENTS

| | | | | |
|---|---|---|---|---|
| 5,577,064 A * | 11/1996 | Swirhun | ............ | B82Y 20/00 257/85 |
| 6,277,668 B1 * | 8/2001 | Goossen | ............ | H01S 5/0262 438/69 |
| 6,485,995 B2 * | 11/2002 | Trezza | ............ | H01L 25/0753 257/E25.02 |
| 2010/0142976 A1 * | 6/2010 | Uemura | ............ | G02B 6/4201 398/183 |

(Continued)

FOREIGN PATENT DOCUMENTS

JP    2006-014189 A    1/2006

*Primary Examiner* — Omar R Rojas
(74) *Attorney, Agent, or Firm* — Sughrue Mion, PLLC

(57) ABSTRACT

A light emitting element array includes plural semiconductor stacking structures and a light screening portion. The plural semiconductor stacking structures each include a light emitting portion and a light receiving portion that receives light propagated in a lateral direction via a semiconductor layer from the light emitting portion. The light screening portion is provided between the plural semiconductor stacking structures to screen light directed from the light emitting portion of one of the semiconductor stacking structures to the light receiving portion of another semiconductor stacking structure.

16 Claims, 10 Drawing Sheets

(56) References Cited

U.S. PATENT DOCUMENTS

| | | | |
|---|---|---|---|
| 2015/0043605 A1* | 2/2015 | Koyama | H01S 5/02284 372/50.1 |
| 2017/0168234 A1* | 6/2017 | Shi | G02B 6/12004 |
| 2018/0019362 A1* | 1/2018 | Jogan | H01L 31/035236 |
| 2018/0019574 A1* | 1/2018 | Jogan | H01S 5/0264 |

* cited by examiner

LIGHT EMITTING ELEMENT ARRAY AND OPTICAL TRANSMISSION DEVICE

CROSS-REFERENCE TO RELATED APPLICATIONS

This application is based on and claims priority under 35 USC 119 from Japanese Patent Application No. 2016-158002 filed Aug. 10, 2016.

BACKGROUND

Technical Field

The present invention relates to a light emitting element array and an optical transmission device.

SUMMARY

According to an aspect of the present invention, there is provided a light emitting element array including plural semiconductor stacking structures each including a light emitting portion and a light receiving portion that receives light propagated in a lateral direction via a semiconductor layer from the light emitting portion, and a light screening portion provided between the plural semiconductor stacking structures to screen light directed from the light emitting portion of one of the semiconductor stacking structures to the light receiving portion of another semiconductor stacking structure.

BRIEF DESCRIPTION OF THE DRAWINGS

Exemplary embodiments of the present invention will be described in detail based on the following figures, wherein.

DETAILED DESCRIPTION

Exemplary embodiments of the present invention will be described in detail below with reference to the drawings. In light emitting element arrays according to the exemplary embodiments, each of light emitting elements that constitute the light emitting element array is integrated with a monitor photo diode (hereinafter a "monitor PD") that receives a part of an optical output from a light emitting portion. The usage of the light emitting element arrays according to the exemplary embodiments is not specifically limited. By way of example, the light emitting element arrays are used for an optical transmission device of a multi-channel parallel transmission type or a writing device that writes an image onto a photoconductor in an image forming device. In the exemplary embodiments, the light emitting elements are arranged linearly (one-dimensionally) to form a line light source. However, the light emitting elements may be arranged two-dimensionally.

First Exemplary Embodiment

Figure 1:
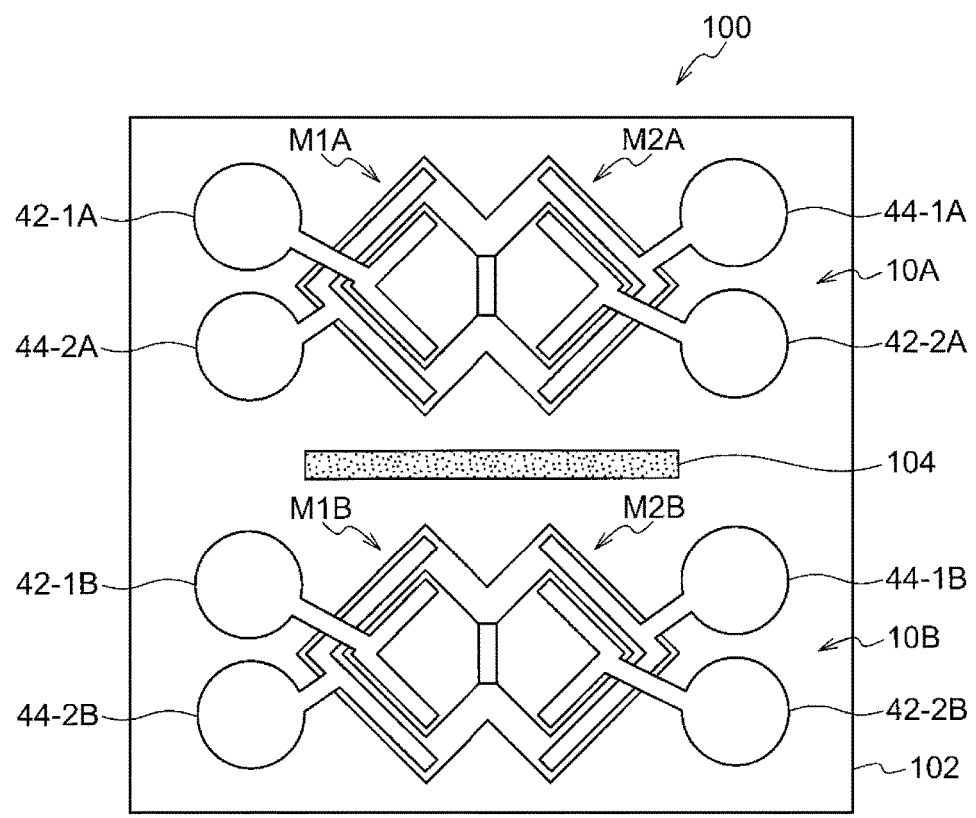
FIG. 1 is a plan view illustrating an example of the configuration of a light emitting element array according to a first exemplary embodiment.
Figure 2A:
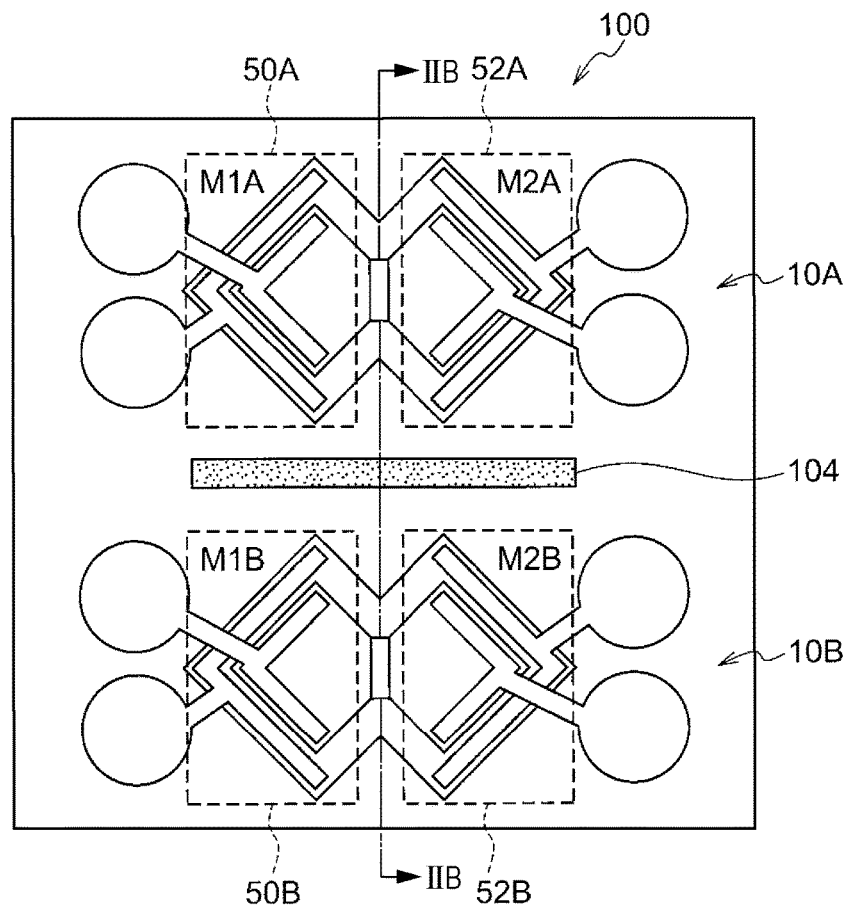
FIGS. 2A and 2B are a plan view and a sectional view, respectively, illustrating the configuration of a light emitting portion and a light receiving portion of the light emitting element array according to the first exemplary embodiment.
Figure 2B:
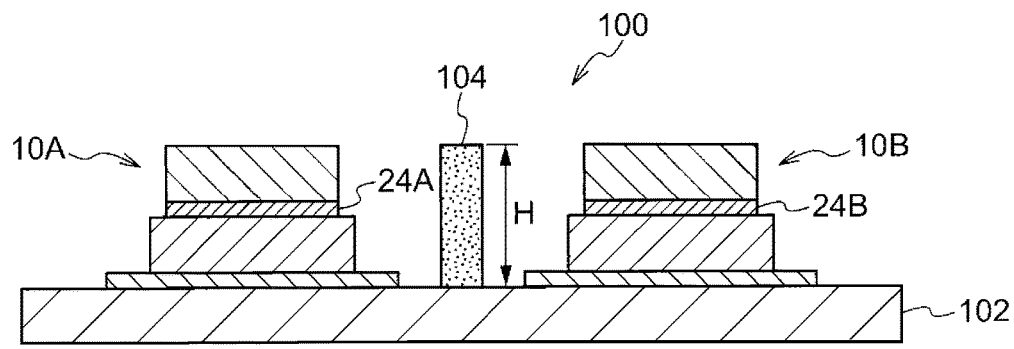
Figure 10:
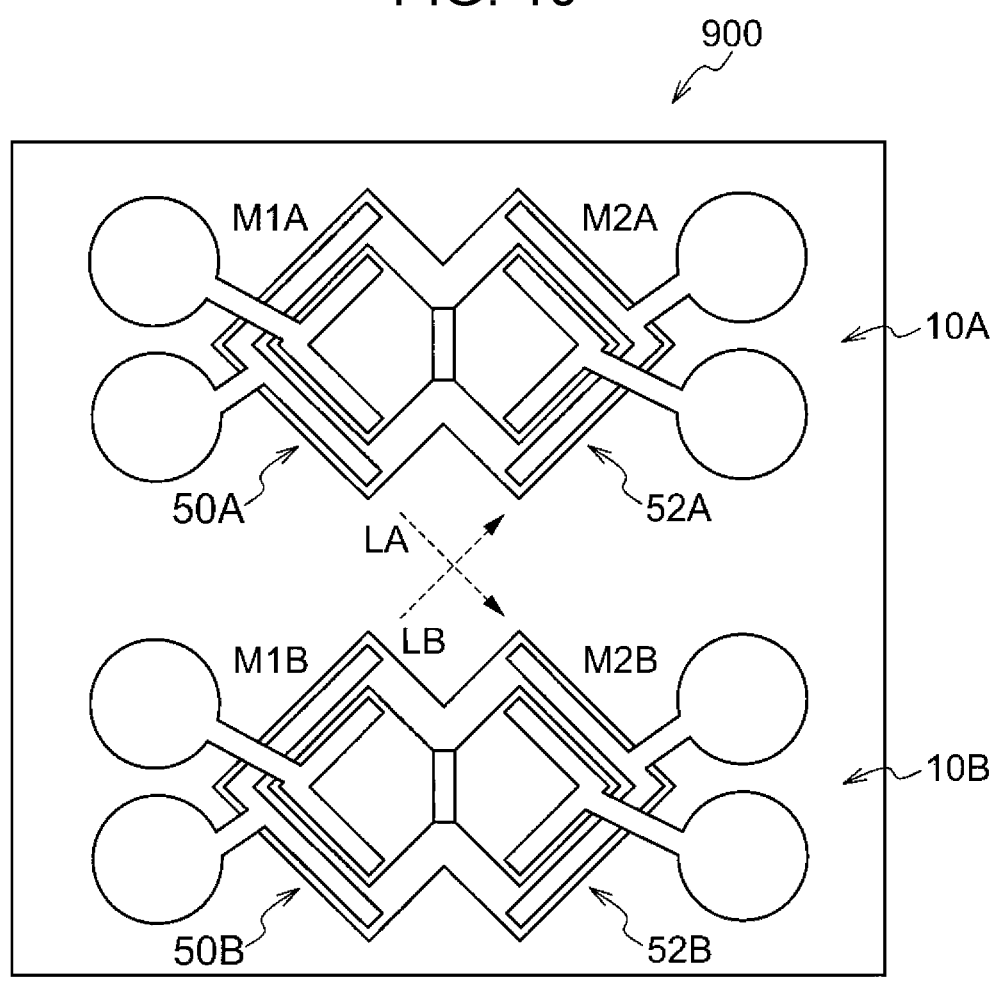
FIG. 10 is a plan view illustrating the configuration of a light emitting element array according to a comparative example.

A light emitting element array 100 according to an exemplary embodiment will be described with reference to FIGS. 1, 2A, 2B, and 10. FIG. 1 is a plan view of the light emitting element array 100. FIG. 2A is a plan view illustrating a light emitting portion and a light receiving portion of the light emitting element array 100. FIG. 2B is a sectional view taken along the line IIB-IIB in FIG. 2A. FIG. 10 illustrates a light emitting element array 900 according to a comparative example that does not include a light screening portion of the light emitting element array 100. In the exemplary embodiment, in order to describe the basic configuration of the light emitting element array, the light emitting element array is formed with two light emitting elements. However, the light emitting element array may be formed with a necessary number of light emitting elements in accordance with the usage etc.

As illustrated in FIG. 1, the light emitting element array 100 includes light emitting elements 10A and 10B monolithically formed on a substrate 102 made of a semiconductor. The light emitting element 10A includes two mesas M1A and M2A. As illustrated in FIG. 2A, the mesa M1A constitutes a light emitting portion 50A, and the mesa M2A constitutes a light receiving portion 52A. The light receiving portion 52A has a function of a monitor PD that monitors an optical output from the light emitting portion 50A. Similarly, the light emitting element 10B includes two mesas M1B and M2B, the mesa M1B constitutes a light emitting portion 50B, and the mesa M2B constitutes a light receiving portion 52B. The light receiving portion 52B has a function of a monitor PD that monitors an optical output from the light emitting portion 50B. The light emitting elements 10A and 10B (hereinafter "light emitting elements 10" when referred to collectively) will be discussed in detail later. The light emitting portions 50A and 50B according to the exemplary embodiment are constituted as surface emitting semiconductor lasers (vertical cavity surface emitting lasers: VCSELs). Hereinafter, the light emitting portions 50A and 50B (VCSELs) will be referred to as "light emitting portions 50" when referred to collectively, and the light receiving portions 52A and 52B (monitor PDs) will be referred to as "light receiving portions 52" when referred to collectively.

The light emitting element 10A includes a p-side electrode pad 42-1A and an n-side electrode pad 44-2A that supply power to the light emitting portion 50A, and a p-side electrode pad 42-2A and an n-side electrode pad 44-1A that supply power to the light receiving portion 52A. Similarly, the light emitting element 10B includes a p-side electrode pad 42-1B and an n-side electrode pad 44-2B that supply power to the light emitting portion 50B, and a p-side electrode pad 42-2B and an n-side electrode pad 44-1B that supply power to the light receiving portion 52B. As illustrated in FIG. 1, the light emitting element array 100 further includes a light screening portion 104 (light screening wall). The light screening portion 104 is formed by etching a semiconductor layer that constitutes the light emitting element 10, by way of example. That is, the light screening portion 104 is constituted of a semiconductor layer that is common with the semiconductor layer that constitutes the light emitting element 10.

The function of the light screening portion 104 will be described with reference to FIG. 10. As discussed later, the mesa M1A which constitutes the light emitting portion 50A, or the mesa M1B which constitutes the light emitting portion 50B, includes active regions 24 (see FIGS. 3A, 3B, 4A, and 4B; indicated as active regions 24A and 24B in FIG. 2B; hereinafter "active regions 24" when referred to collectively) that serve as active layers when the light emitting portion 50A or the light emitting portion 50B oscillates laser as a VCSEL. The side surface of the mesa M1A, or the mesa M1B, which includes the active regions 24 is normally covered with an insulating film. However, the insulating film is normally constituted of a translucent material, and does not have a light screening function. Therefore, leaked light LA leaks from the active region 24A of the light emitting portion 50A to the surroundings, and leaked light LB leaks from the active region 24B of the light emitting portion 50B to the surroundings.

As illustrated in FIG. 10, the leaked light LA serves as a noise source principally for the light receiving portion 52B, and the leaked light LB serves as a noise source principally for the light receiving portion 52A. That is, when the leaked light LB enters the light receiving portion 52A from the side surface or the light receiving surface (upper surface) of the mesa M2A which constitutes the light receiving portion 52A, or when the leaked light LA enters the light receiving portion 52B from the side surface or the light receiving surface (upper surface) of the mesa M2B which constitutes the light receiving portion 52B, the signal-to-noise (S/N) ratio of a received light current for the light receiving portion 52A or 52B may be degraded, which makes accurate monitoring difficult.

Therefore, the light emitting element array 100 is provided with the light screening portion 104 which screens (blocks) the leaked light LA or LB described above. The light screening portion 104 is formed so as to face at least a part the outer periphery of the light receiving portions 52 (monitor PDs) in consideration of the function of the light screening portion 104. The light screening portion 104 is formed such that the height of the light screening portion 104 is at least larger than the height of the active regions 24 of the light emitting portions 50 (VCSELs). An active region in the light screening portion 104 functions as a light absorbing layer that efficiently absorbs the leaked light. In the light emitting element array 100 according to the exemplary embodiment, as illustrated in FIG. 2B, a height H of the light screening layer 104 is generally the same as the height of the light emitting elements 10.

Figure 3A:
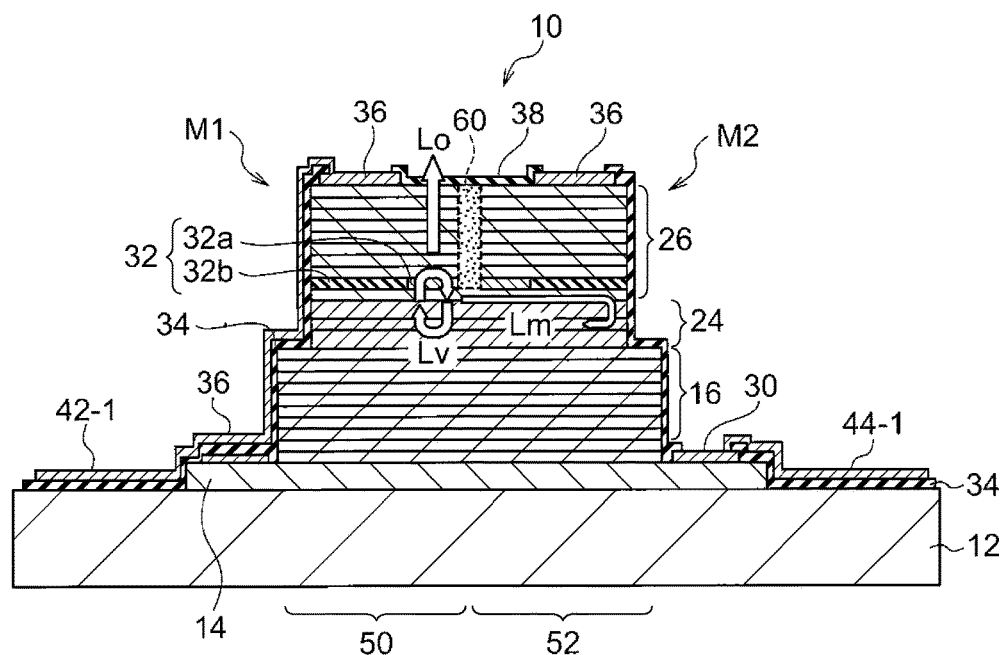
FIGS. 3A and 3B are a sectional view and a plan view, respectively, illustrating an example of the configuration of a light emitting element according to the exemplary embodiment.
Figure 3B:
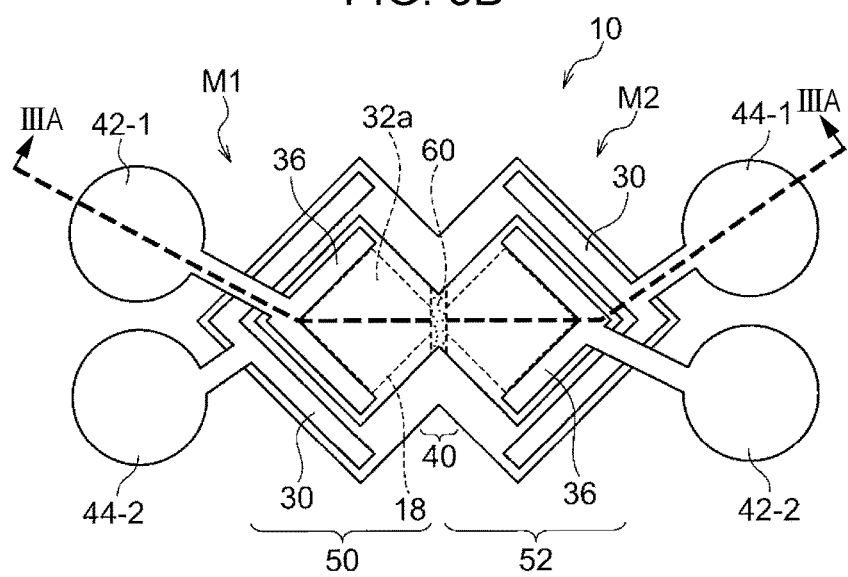

Next, an example of the configuration of the light emitting element 10 according to the exemplary embodiment will be described with reference to FIGS. 3A and 3B. In the exemplary embodiment, the light emitting element according to the present invention is applied to a VCSEL. FIGS. 3A and 3B are a sectional view and a plan view, respectively, of the light emitting element 10 according to the exemplary embodiment. The sectional view illustrated in FIG. 3A is taken along the line IIIA-IIIA in the plan view illustrated in FIG. 3B.

As illustrated in FIG. 3A, the light emitting element 10 includes a contact layer 14 of n-type gallium arsenide (GaAs) formed on a substrate 12 of semi-insulating GaAs, a lower distributed Bragg reflector (DBR) 16, the active region 24, an oxide confining layer 32, and an upper DBR 26.

As illustrated in FIG. 3B, the light emitting element 10 includes two mesas (columnar structures), namely a mesa M1 and a mesa M2 in a generally rectangular shape, and has a coupling portion 40 at a portion at which the mesa M1 and the mesa M2 are connected to each other. The coupling portion 40 according to the exemplary embodiment is provided at a narrowed portion of a semiconductor layer formed by connecting the mesa M1 and the mesa M2 to each other. The mesa M1 and the mesa M2 include the lower DBR 16, the active region 24, the oxide confining layer 32, and the upper DBR 26 which are commonly formed on the contact layer 14.

A current interrupting region 60 formed in the upper DBR 26 is disposed between the mesa M1 and the mesa M2, that is, at the coupling portion 40. The current interrupting region 60 according to the exemplary embodiment is a highly resistive region formed by implanting $H^+$ ions (protons), by way of example, from the upper surfaces of the mesas M1 and M2 to the oxide confining layer 32 (i.e. to a depth not reaching the active regions 24), and electrically separates the mesa M1 and the mesa M2 from each other. In the light emitting element 10 according to the exemplary embodiment, as described above, the mesa M1 constitutes the light emitting portion 50 (VCSEL), and the mesa M2 constitutes the light receiving portion 52 (monitor PD) which receives an optical output from the light emitting portion. Hereinafter, the entire structure constituted from the mesa M1 and the mesa M2 will be referred to as a "mesa M".

The current interrupting region 60 is intended to improve the accuracy in detecting an optical output (improve the S/N ratio) by at least partially electrically separating the light emitting portion and the light receiving portion from each other, and is an optional component. That is, the current interrupting region 60 may not be provided depending on the degree of allowance of the detection accuracy.

As illustrated in FIG. 3A, an interlayer insulating film 34 which is an inorganic insulating layer is applied to the periphery of the semiconductor layer which includes the mesa M. The interlayer insulating film 34 extends from the side surface of the mesa M to the surface of the substrate 12, and is disposed under the p-side electrode pad 42-1 and the n-side electrode pad 44-1. The interlayer insulating film 34 according to the exemplary embodiment is formed as a silicon nitride film (SiN film), by way of example. The interlayer insulating film 34 is not limited to the silicon nitride film, and may be a silicon oxide film ($SiO_2$ film), a silicon oxynitride film (SiON film), or the like, for example.

As illustrated in FIG. 3A, p-side electrode wiring 36 is provided via an opening portion of the interlayer insulating film 34. The uppermost layer of the upper DBR 26 is provided with a contact layer (not illustrated) for connection with the p-side electrode wiring 36. One end of the p-side electrode wiring 36 is connected to the upper DBR 26 via the contact layer to form ohmic contact with the upper DBR 26. The other end of the p-side electrode wiring 36 extends from the side surface of the mesa M to the surface of the substrate 12 to constitute the p-side electrode pad 42-1. The p-side electrode wiring 36 is formed by applying a stacked film of titanium (Ti)/gold (Au), for example. Hereinafter, the p-side electrode pad 42-1 and the p-side electrode pad 42-2 (see FIG. 3B) will be referred to as "p-side electrode pads 42" when referred to collectively. In the light emitting element 10, the p-side electrode constitutes an anode.

Similarly, n-side electrode wiring 30 is provided via an opening portion of the interlayer insulating film 34. One end of the n-side electrode wiring 30 is connected to the contact layer 14 to form ohmic contact with the contact layer 14. Meanwhile, the other end of the n-side electrode wiring 30 extends to the surface of the substrate 12 to form the n-side electrode pad 44-1 as illustrated in FIG. 3A. The n-side electrode wiring 30 is formed by applying a stacked film of AuGe/Ni/Au, for example. Hereinafter, the n-side electrode pad 44-1 and the n-side electrode pad 44-2 (see FIG. 3B) will be referred to as "n-side electrode pads 44" when referred to collectively. In the light emitting element 10, the n-side electrode constitutes a cathode.

As described above, a semi-insulating GaAs substrate, by way of example, is used as the substrate 12 according to the exemplary embodiment. The semi-insulating GaAs substrate is a GaAs substrate that is not doped with impurities. The semi-insulating GaAs substrate has a remarkably high resistivity, and has a sheet resistance value of about several megohms.

The contact layer 14 which is formed on the substrate 12 is formed as a GaAs layer doped with Si, by way of example. One end of the contact layer 14 is connected to the n-type lower DBR 16, and the other end of the contact layer 14 is connected to the n-side electrode wiring 30. That is, the contact layer 14 is interposed between the lower DBR 16 and the n-side electrode wiring 30, and has a function of applying a certain potential to the semiconductor layer which is constituted of the mesa M. The contact layer 14 may also serve as a buffer layer provided to improve the crystallinity of the substrate surface after thermal cleaning.

The n-type lower DBR 16 which is formed on the contact layer 14 is a multilayer reflective mirror constituted by repeatedly and alternately stacking two semiconductor layers with a film thickness of $0.25\lambda/n$ and with different refractive indices from each other, where $\lambda$ indicates the oscillation wavelength of the semiconductor layer 10 and n indicates the refractive index of the medium (semiconductor layer). Specifically, the lower DBR 16 is constituted by repeatedly and alternately stacking an n-type low-refractive index layer of $Al_{0.90}Ga_{0.1}As$ and an n-type high-refractive index layer of $Al_{0.15}Ga_{0.85}As$. The semiconductor layer 10 according to the exemplary embodiment has an oscillation wavelength of 850 nm, by way of example.

The active region 24 according to the exemplary embodiment may include a lower spacer layer, a quantum well active layer, and an upper spacer layer (not illustrated), for example. The quantum well active layer according to the exemplary embodiment may be constituted of four barrier layers of $Al_{0.3}Ga_{0.7}As$ and three quantum well layers of GaAs provided therebetween, for example. The lower spacer layer and the upper spacer layer are disposed between the quantum well active layer and the lower DBR 16 and between the quantum well active layer and the upper DBR 26, respectively, and have a function of adjusting the length of a resonator and a function as a cladding layer for carrier confinement. In the light emitting element 10, the mesa M1 constitutes a VCSEL, and thus the active region 24 in the mesa M1 constitutes a light emitting layer. On the other hand, the mesa M2 constitutes a monitor PD, and thus the active region 24 in the mesa M2 substantially functions as a light absorbing layer.

The p-type oxide confining layer 32 which is provided on the active region 24 is a current confining layer, and includes a non-oxidized region 32a and an oxidized region 32b. A current that flows from the p-side electrode pad 42-1 toward the n-side electrode pad 44-2 is throttled by the non-oxidized region 32a. A boundary 18 illustrated in FIG. 3B indicates the boundary between the non-oxidized region 32a and the oxidized region 32b. As illustrated in FIG. 3B, the non-oxidized region 32a according to the exemplary embodiment which is delimited by the boundary 18 is shaped to be narrowed at the coupling portion 40.

The upper DBR 26 which is formed on the oxide confining layer 32 is a multilayer reflective mirror constituted by repeatedly and alternately stacking two semiconductor layers with a film thickness of $0.25\lambda/n$ and with different refractive indices from each other. Specifically, the upper DBR 26 is constituted by repeatedly and alternately stacking a p-type low-refractive index layer of $Al_{0.90}Ga_{0.1}As$ and a p-type high-refractive index layer of $Al_{0.15}Ga_{0.85}As$.

An emission surface protecting layer 38 that protects a light emission surface is provided on the upper DBR 26. The emission surface protecting layer 38 is formed by applying a silicon nitride film, by way of example.

The light emitting elements (VCSELs) described above allow taking out a laser output in a direction perpendicular to a substrate, and are easily integrated two-dimensionally into an array. Thus, the light emitting elements are used as a writing light source for electrophotographic systems or an optical communication light source.

The VCSEL includes a pair of distributed Bragg reflectors (the lower DBR 16 and the upper DBR 26) provided on a semiconductor substrate (substrate 12), and an active region (the active region 24 which includes the active layer, the lower spacer layer, and the upper spacer layer) provided between the pair of distributed Bragg reflectors. A current is injected into the active layer by electrodes (the p-side electrode wiring 36 and the n-side electrode wiring 30) provided on both sides of the distributed Bragg reflectors, and laser oscillation is caused perpendicularly to the substrate surface so that oscillated light is emitted from the upper portion (side of the surface of the emission surface protecting layer 38) of the element.

Semiconductor laser, not only a VCSEL, is occasionally desired to be stable so that the optical output of the semiconductor laser is not fluctuated along with temperature fluctuations, power fluctuations, etc. An automatic power control (APC) method is employed as a method for stabilization. In the APC method, an optical output from the semiconductor laser is negatively feedback-controlled by detecting the optical output from the semiconductor laser as a monitor current using a monitor PD or the like, comparing the detected monitor current with a reference value to calculate a difference value, and varying a drive current for the semiconductor laser using the difference value.

It is often difficult to monolithically integrate the semiconductor laser and the monitor PD for reasons of being constituted of different semiconductor materials etc. In this case, the monitor PD is provided outside the semiconductor laser. Thus, if the semiconductor laser and the monitor PD are monolithically integrated with each other, the number of components is reduced, and the effect of noise or the like is reduced in favor of stable operation.

A VCSEL in which a monitor PD is formed on a light emission surface to monitor an optical output emitted from the light emission surface is known as a VCSEL according to the related art with which a monitor PD is monolithically integrated. The monitor PD of the VCSEL according to the related art is formed of silicon (Si) on a dielectric DBR.

In the VCSEL according to the related art described above, however, it is necessary that the monitor PD should be formed of a material that is different from that of the body on the light emission surface, which complicates the structure or the manufacturing process. In addition, the presence of light emitted from the VCSEL and absorbed by the monitor PD without contributing to signal transmission lowers the light emitting efficiency of the VCSEL.

Thus, in the light emitting element according to the embodiment, a VCSEL and a monitor PD are formed on an identical substrate, and the VCSEL and the monitor PD are coupled to each other in a direction parallel to the substrate (i.e. a direction that intersects the direction of oscillation by the light emitting portion; hereinafter occasionally referred to as a "lateral direction") via a semiconductor layer that is the same as the VCSEL or the monitor PD. That is, the monitor PD of the light emitting element 10 according to the embodiment receives leaked light (propagated light) propagated in the lateral direction from the VCSEL.

In the VCSEL according to the related art described above, further, no measures are taken against extraneous light to the monitor PD. Therefore, in the case where such VCSELs are formed into an array, output light principally from an adjacent VCSEL may enter the monitor PD as extraneous light to serve as noise for the monitor PD. When noise enters the monitor PD, the S/N ratio of the monitor current may be degraded, and the APC control may become unstable. It is necessary to give consideration to this matter also for the light emitting element according to the embodiment.

More particularly, in the light emitting element (VCSEL) according to the embodiment configured as described above, light that enters the semiconductor layer (in particular, the active region) of the monitor PD from the side surface or the upper surface (light receiving surface) of the monitor PD serves as a remarkable noise source when monitoring an optical output from the VCSEL or when performing the APC control. That is, the light degrades the S/N ratio of the monitor current in the monitor PD. In order to improve the S/N ratio in monitoring an optical output or in the APC control, it is necessary that light other than leaked light propagated in the lateral direction from the VCSEL side should not be received by the monitor PD.

Thus, the light emitting element array according to the exemplary embodiment further includes a light screening portion provided between the monitor PD and an adjacent VCSEL.

The configuration of the light emitting element 10 according to the exemplary embodiment will be described in more detail. The VCSEL includes an oxide confining layer (oxide confining layer 32) formed by oxidizing a semiconductor layer containing Al in its composition from the viewpoint of threshold current reduction, lateral mode controllability, etc. in many cases. In order to oxidize the semiconductor layer containing Al, the element is etched into a mesa shape, and subjected to an oxidation process. After that, in general, the side surface of the mesa shape exposed by etching or the semiconductor surface which has been etched is covered by an insulating material such as a silicon nitride film or a silicon oxide film.

In the light emitting element 10, the non-oxidized region 32a and the oxidized region 32b are formed by an oxidation process for the mesa M. The boundary 18 illustrated in FIG. 3B indicates the boundary between the non-oxidized region 32a and the oxidized region 32b. That is, the non-oxidized region 32a delimited by the boundary 18 is formed to extend from the mesa M1 to the mesa M2.

The oxidized region 32b is oxidized and has a high electrical resistance, and thus functions as a non-conductive region. A current injected from the p-side electrode pad 42-1 is confined in the non-oxidized region 32a. In general, a semiconductor has a lowered refractive index when oxidized. Thus, the refractive index of the non-oxidized region 32a is higher than the refractive index of the oxidized region 32b. Therefore, light emitted by the light emitting portion is confined in the non-oxidized region 32a which is surrounded by the oxidized region 32b with a low refractive index. That is, light and a current are confined in the non-oxidized region 32a by the oxide confining layer.

In the light emitting element 10, the non-oxidized region 32a is formed to extend from the light emitting portion 50, which is constituted of the mesa M1, to the light receiving portion 52, which is constituted of the mesa M2. Therefore, a part of laser oscillation light generated by the light emitting portion 50 is propagated in the lateral direction (a direction parallel to the substrate 12), and reaches the light receiving portion 52 (monitor PD) to be converted into a current (monitor current). In the case where the APC control is performed using a voltage signal, a current-voltage conversion unit may be provided after the light receiving portion 52.

In this way, in the light emitting element 10 according to the exemplary embodiment, the light emitting portion which is constituted of the mesa M1 and the light receiving portion which is constituted of the mesa M2 are optically coupled to each other to constitute a coupled resonator, and light seeping from the light emitting portion is propagated through the coupling portion 40 to be detected as a monitor current by a detection unit connected to the light receiving portion.

The coupling resonator according to the exemplary embodiment will be described in more detail with reference to FIG. 3A. In the light emitting element 10, as discussed above, the light emitting portion 50 (VCSEL) is formed by the mesa M1, and the light receiving portion 52 (monitor PD) is formed by the mesa M2. In the light emitting portion 50, a positive electrode of a VCSEL power source (not illustrated) is connected to the p-side electrode pad 42-1, and a negative electrode of the VCSEL power source is connected to the n-side electrode pad 44-2 (forward bias). By applying a drive current between the p-side electrode pad 42-1 and the n-side electrode pad 44-2, oscillation light Lv is generated by a resonator formed by the lower DBR 16 and the upper DBR 26 as illustrated in FIG. 3A. A part of the oscillation light Lv is emitted as emitted light Lo from the emission surface protecting layer 38.

As illustrated in FIG. 3A, a part of the oscillation light Lv is propagated in the lateral direction as propagated light Lm (monitor light, leaked light). The propagated light Lm is propagated from the light emitting portion 50 to the light receiving portion 52 while totally reflecting in the resonator which is formed by the lower DBR 16 and the upper DBR 26. Therefore, the propagated light Lm is so-called slow light with a reduced group velocity. In the light receiving portion 52, on the other hand, a positive electrode of a monitor PD power source (not illustrated) is connected to the n-side electrode pad 44-1, and a negative electrode of the monitor PD power source is connected to the p-side electrode pad 42-2 (reverse bias).

An optical output from the light emitting portion 50 is monitored by applying a received light current due to the propagated light Lm between the n-side electrode pad 44-1 and the p-side electrode pad 42-2. In this event, the active region 24 which constitutes the light emitting portion is also used as the light absorbing layer of the light receiving portion 52. Therefore, the light absorbing layer which constitutes the light receiving portion 52 does not have a sufficient film thickness. Since the monitor light according to the exemplary embodiment is slow light as described above, however, a carrier is easily generated and a sufficient photocurrent is obtained even with a thin light absorbing layer.

Next, the function of the coupling portion 40 according to the exemplary embodiment will be described in more detail. In the coupling portion 40, as illustrated in FIG. 3B, the non-oxidized region 32a and the oxidized region 32b have a narrowed shape. Therefore, the width of the non-oxidized region 32a is changed in the order of "wide", "narrow", and "wide" from the light emitting portion 50 to the light receiving portion 52 illustrated in FIG. 3B.

Meanwhile, the proportion of the area of the oxidized region 32b to the area of the non-oxidized region 32a is changed in the order of "small", "large", and "small". As described above, the refractive index of the non-oxidized region 32a is higher than the refractive index of the oxidized region 32b. As well known, when the proportion of a material with a low refractive index in the surroundings is increased in an optical waveguide, the refractive index (equivalent refractive index or effective refractive index) which is sensed by light propagated through the optical waveguide is lowered. Therefore, the equivalent refractive index of the non-oxidized region 32a in the coupling portion 40 is lower than the equivalent refractive index of the non-oxidized region 32a of the light emitting portion 50 and the light receiving portion 52 on both sides. That is, the equivalent refractive index of the non-oxidized region 32a is changed in the order of "high", "low", and "high" from the light emitting portion 50 to the light receiving portion 52. The term "equivalent refractive index" used in the exemplary embodiment refers to the effective refractive index (the refractive index of a multilayer semiconductor layer is considered as the refractive index of a single layer) of semiconductor layers with different refractive indices stacked in a direction perpendicular to a substrate, calculated by an equivalent refractive index method.

In the light emitting element 10, which has the equivalent refractive index distribution discussed above, light emitted by the light emitting element 50 (VCSEL) is efficiently confined in the non-oxidized region 32a, and light (slow light) seeps from the light emitting portion 50 to be received by the light receiving portion 52. In the case where the equivalent refractive index of the non-oxidized region 32a is changed in the order of "high", "high", and "high", that is, generally uniform, from the light emitting portion 50 to the light receiving portion 52, it is difficult to confine light in the light emitting portion 50. In the case where the equivalent refractive index of the non-oxidized region 32a is changed in the order of "high", "low", and "low" from the light emitting portion 50 to the light receiving portion 52, on the other hand, light may be confined in the light emitting portion 50, but less light seeps, which makes it difficult to detect a monitor current, for example, and also degrades the S/N ratio.

In the exemplary embodiment, the equivalent refractive index is changed in the order of "high", "low", and "high" by reducing the width of the non-oxidized region 32a in the coupling portion 40. However, the present invention is not limited thereto. For example, the equivalent refractive index may be changed in the order of "high", "low", and "high" by providing a groove at the position of the coupling portion 40 (between the light emitting portion 50 and the light receiving portion 52). In addition, the configuration with a reduced width and the configuration with a groove may be combined with each other. In this case, the groove may be filled with a material (e.g. air) with a refractive index that is lower than that of the surrounding semiconductor layer.

Figure 4A:
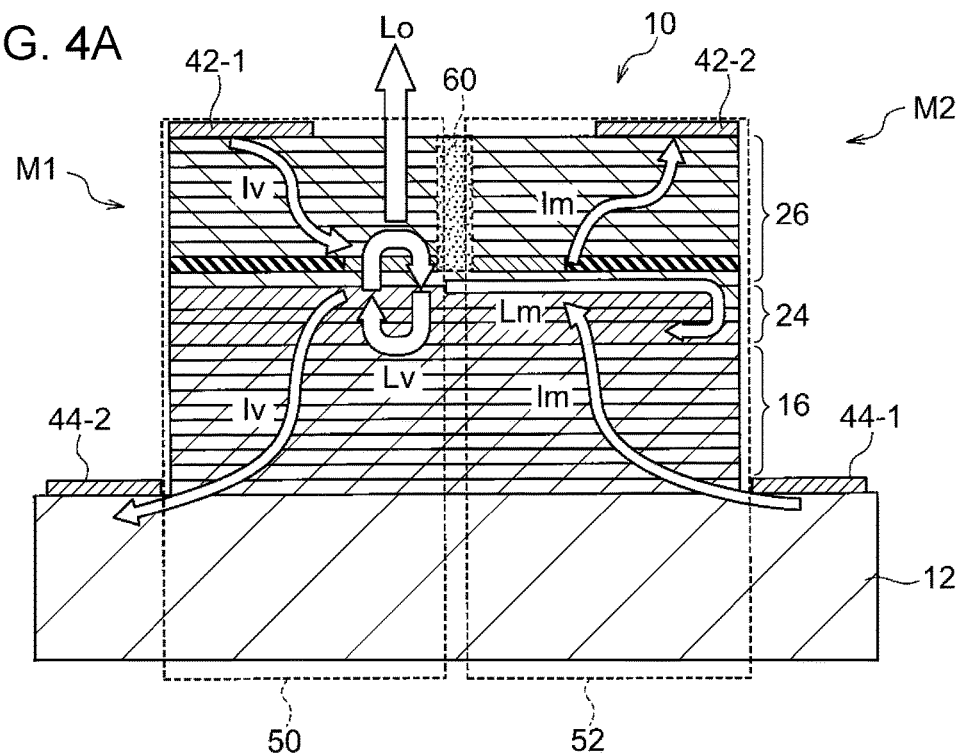
FIGS. 4A and 4B illustrate the function of the light emitting element according to the exemplary embodiment.
Figure 4B:
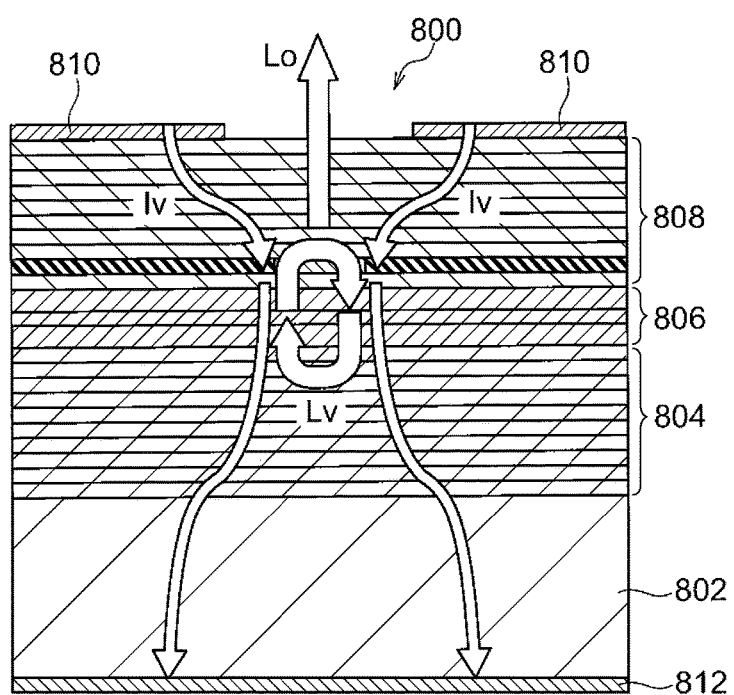

Next, drive of the light emitting element 10 will be described with reference to FIG. 4. FIG. 4A illustrates a current that flows through the light emitting element 10 according to the exemplary embodiment. In the drawing, the electrodes are depicted schematically so that the flow of the current may be understood intuitively. That is, as illustrated in FIG. 4A, the p-side electrode pad 42-1 and the n-side electrode pad 44-2 are connected to the light emitting portion 50, and the n-side electrode pad 44-1 and the p-side electrode pad 42-2 are connected to the light receiving portion 52. FIG. 4B illustrates a current that flows through a common light emitting element (VCSEL) 800 according to the related art described for comparison.

As illustrated in FIG. 4B, the light emitting element 800 according to the related art includes a lower DBR 804 formed on a substrate 802 of GaAs, an active region 806, an upper DBR 808, and p-side electrode wiring 810. The light emitting element 800 also includes a back surface electrode 812 in place of the n-side electrode pad 44 in the light emitting element 10. When a drive current Iv is applied between the p-side electrode wiring 810 and the back surface electrode 812 of the thus configured light emitting element 800, oscillated light Lv is generated, and a part of the oscillated light Lv is emitted to the outside as emitted light Lo. In the light emitting element 800, in general, a part of the emitted light Lo is monitored by a monitor PD, and a certain loss is unavoidably caused in the part of the emitted light Lo.

In the light emitting element 10 according to the exemplary embodiment, in contrast, when a drive current Iv is applied with a positive electrode and a negative electrode of a power source for the light emitting portion 50 connected to the p-side electrode pad 42-1 and the n-side electrode pad 44-2, respectively, oscillated light Lv is generated by the resonator which is constituted of the lower DBR 16 and the upper DBR 26, and a part of the oscillated light Lv is output to the outside as emitted light Lo. Meanwhile, when a positive electrode and a negative electrode of a power source for the light receiving portion 52 are connected to the n-side electrode pad 44-1 and the p-side electrode pad 42-2, respectively, propagated light Lm is converted into a monitor current Im. The monitor current Im is converted into a voltage through current-voltage conversion to be used as a feedback signal in the APC control. That is, monitoring of an optical output in the light emitting element 10 according to the exemplary embodiment employs characteristics that the amount of the propagated light Lm is proportional to the amount of the emitted light Lo from the light emitting portion 50 (VCSEL).

In the light emitting element 10, as described above, the emitted light Lo from the light emitting portion 50 is efficiently monitored by directly monitoring the propagated light Lm which is a part of the oscillated light Lv. In a light emitting element array in which plural light emitting elements 10 are disposed side by side, however, it is desirable to suppress the effect of disturbance light on the light receiving portion 52. That is, there may be provided a unit that suppresses the effect of disturbance light that enters the light receiving portion 52 from the side surface or the upper surface of the mesa M2 of the light receiving portion 52 which serves as a noise source in monitoring of an optical output in the light receiving portion or in the APC control.

Thus, as discussed above, the light emitting element array 100 according to the exemplary embodiment is provided with the light screening portion 104 illustrated in FIG. 1. The light screening portion 104 may be formed to face at least a part of the outer periphery of the light receiving portion 52 (monitor PD), and formed such that the height H (see FIG. 2B) of the light screening portion 104 is at least larger than the height of the active region 24 of the light emitting portion 50 (VCSEL). It is not necessary that the light screening portion 104 should be formed such that the height H of the light screening portion 104 is larger than the height of the active region 24 of the light emitting portion 50 (VCSEL). By way of example, the height H of the light screening portion 104 may be equal to or more than half the height of the mesa H. If the height H of the light screening portion 104 is equal to or more than half the height of the mesa M, a large light screening effect is achieved compared to a configuration in which the height H is less than half the height of the mesa M. In addition, the length of the light screening portion 104 as viewed in plan is preferably larger than the length of the light emitting portion 50 or the length of the light receiving portion 52, for example. If the length of the light screening portion 104 is larger than the total of the length of the light emitting portion 50 and the length of the light receiving portion 52, the exemplary embodiment achieves a further conspicuous light screening effect. In the exemplary embodiment, the "length" of the light screening portion 104 as viewed in plan indicates the length of the light screening portion 140 in the longitudinal direction as viewed in plan. Meanwhile, the "length" of the light emitting portion 50 and the "length" of the light receiving portion 52 indicate the lengths of such portions along the longitudinal direction of the light screening portion 104.

Second Exemplary Embodiment

Figure 5:
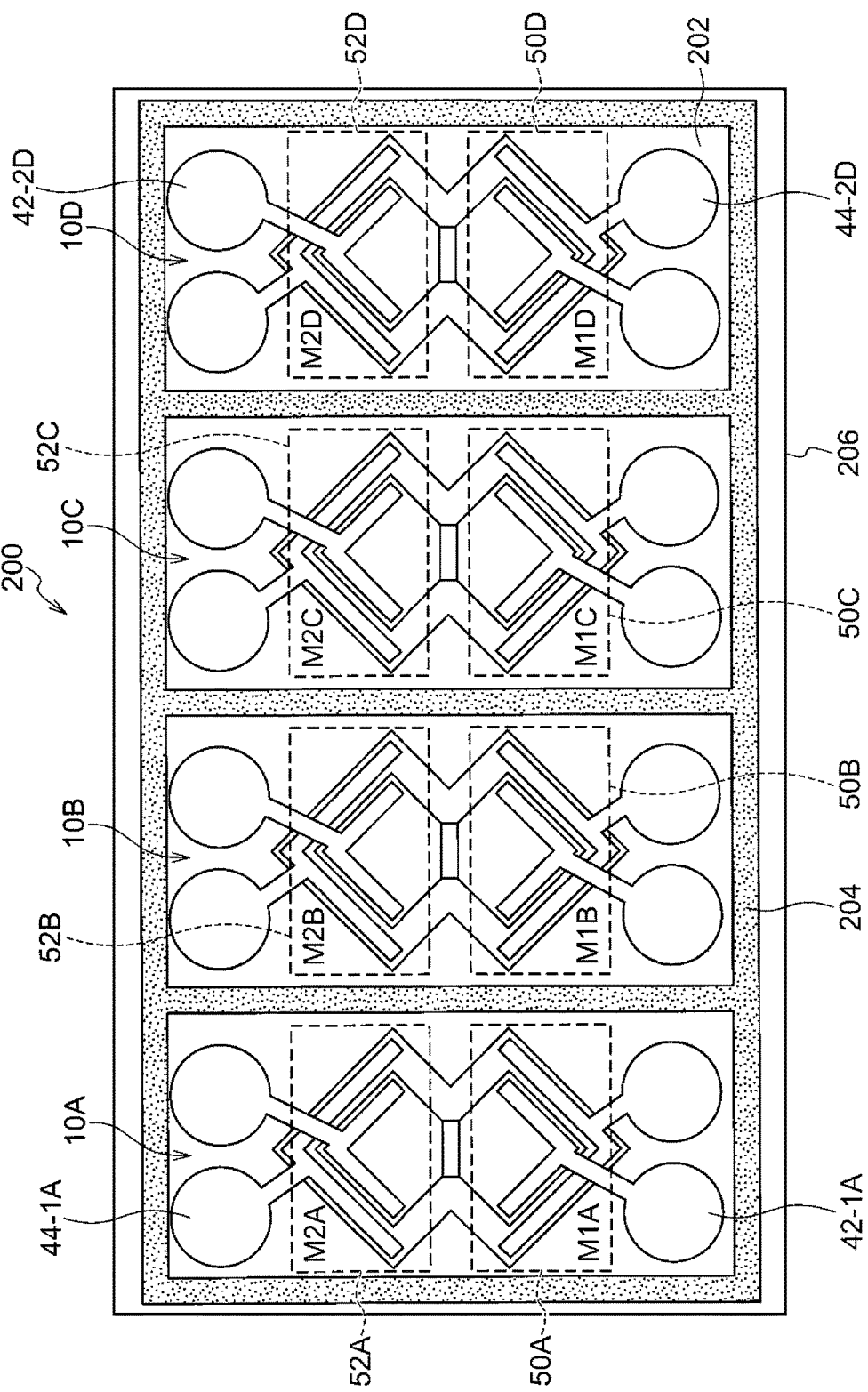
FIG. 5 is a plan view illustrating an example of the configuration of a light emitting element array according to a second exemplary embodiment.

A light emitting element array 200 according to an exemplary embodiment will be described with reference to FIG. 5. In the light emitting element array 200, plural light emitting elements 10 are formed on a substrate 202 of GaAs. In FIG. 5, four light emitting elements 10, namely light emitting elements 10A, 10B, 10C, and 10C, are arranged. However, the number of the light emitting elements 10 is not limited to four, and a necessary number of light emitting elements 10 may be provided in accordance with the usage etc. In FIG. 5, in order to avoid complication, only a p-side electrode pad 42-1A and an n-side electrode pad 44-1A of the light emitting element 10A and a p-side electrode pad 42-2D and an n-side electrode pad 44-2D of the light emitting element 10D are indicated as reference symbols for the electrode pads, and reference symbols for the other electrode pads are omitted.

As illustrated in FIG. 5, the light emitting element array 200 includes the four light emitting elements 10A, 10B, 10C, and 10D, in each of which the light emitting portion 50 and the light receiving portion 52 are disposed in a direction that intersects the direction of arrangement of the light emitting elements 10. Each of the light emitting elements 10A, 10B, 10C, and 10D is monolithically formed on the substrate 202 of GaAs. A light screening post 204 (light screening wall) disposed in a continuous frame shape to surround each of the light emitting elements 10A, 10B, 10C, and 10D is formed around the light emitting elements 10A, 10B, 10C, and 10D.

The light screening post 204 according to the exemplary embodiment is formed integrally with the substrate 202 by etching a semiconductor layer that is common with the light emitting elements 10, by way of example. In addition, the height of the light screening post 204 is generally the same as the height of the mesa M of the light emitting elements 10, by way of example.

The light emitting element array 200 configured as described above is mounted on a mount substrate 206. In the light emitting element array 200 according to the exemplary embodiment, the light screening post 204 in a continuous frame shape which surrounds the light emitting elements 10 is disposed around the light emitting element 10.

Third Exemplary Embodiment

Figure 6:
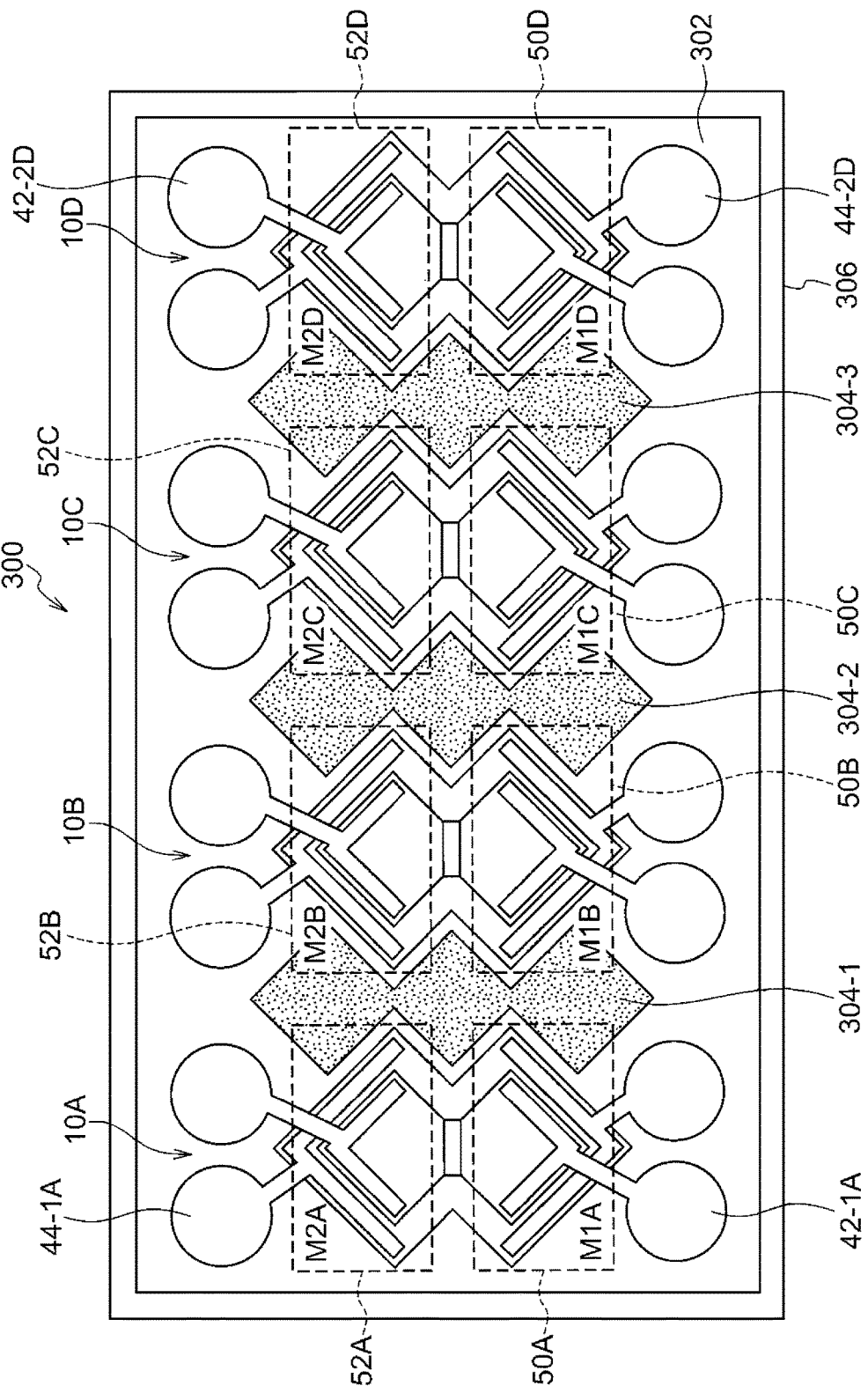
FIG. 6 is a plan view illustrating an example of the configuration of a light emitting element array according to a third exemplary embodiment.

A light emitting element array 300 according to an exemplary embodiment will be described with reference to FIG. 6. In the light emitting element array 300, plural light emitting elements 10 are formed on a substrate 302 of GaAs. In FIG. 6, four light emitting elements 10, namely light emitting elements 10A, 10B, 10C, and 10C, are arranged. However, the number of the light emitting elements 10 is not limited to four, and a necessary number of light emitting elements 10 may be provided in accordance with the usage etc. In FIG. 6, in order to avoid complication, only a p-side electrode pad 42-1A and an n-side electrode pad 44-1A of the light emitting element 10A and a p-side electrode pad 42-2D and an n-side electrode pad 44-2D of the light emitting element 10D are indicated as reference symbols for the electrode pads, and reference symbols for the other electrode pads are omitted.

As illustrated in FIG. 6, the light emitting element array 300 includes the four light emitting elements 10A, 10B, 10C, and 10D, in each of which the light emitting portion 50 and the light receiving portion 52 are disposed in a direction that intersects the direction of arrangement of the light emitting elements 10. Each of the light emitting elements 10A, 10B, 10C, and 10D is monolithically formed on the substrate 302 of GaAs. A light screening post 304-1 is formed between the light emitting element 10A and the light emitting element 10B. A light screening post 304-2 is formed between the light emitting element 10B and the light emitting element 10C. A light screening post 304-3 is formed between the light emitting element 10C and the light emitting element 10D. Hereinafter, the light screening posts 304-1, 304-2, and 304-3 will be referred to as "light screening posts 304" when referred to collectively.

The light screening post 304 according to the exemplary embodiment is formed integrally with the substrate 302 by etching a semiconductor layer that is common with the light emitting elements 10, by way of example. In addition, the height of the light screening post 304 is generally the same as the height of the mesa M of the light emitting elements 10, by way of example.

The light emitting element array 300 configured as described above is mounted on a mount substrate 306. In the light emitting element array 300 according to the exemplary embodiment, the light screening posts 304 which spatially separate the light emitting elements 10 from each other are disposed between the light emitting elements 10.

The light screening posts 304 according to the exemplary embodiment are simpler in shape than the light screening post 204 according to the exemplary embodiment described above.

Fourth Exemplary Embodiment

Figure 7:
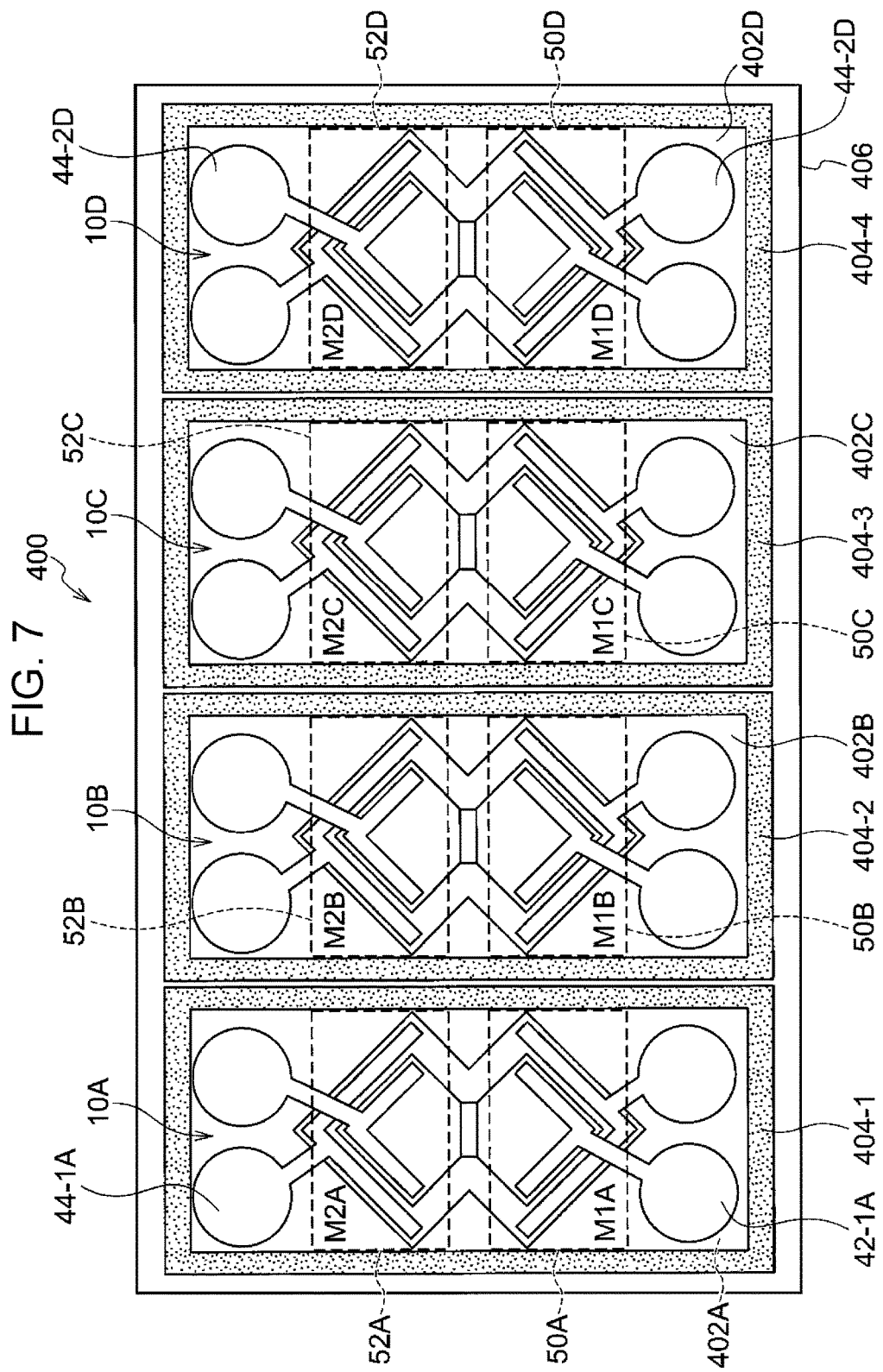
FIG. 7 is a plan view illustrating an example of the configuration of a light emitting element array according to a fourth exemplary embodiment.

A light emitting element array 400 according to an exemplary embodiment will be described with reference to FIG. 7. The light emitting element array 400 is constituted by disposing plural light emitting elements 10, which are each formed on a substrate of GaAs, on a mount substrate to form an array. In FIG. 7, four light emitting elements 10, namely light emitting elements 10A, 10B, 10C, and 10C, are arranged. However, the number of the light emitting elements 10 is not limited to four, and a necessary number of light emitting elements 10 may be provided in accordance with the usage etc. In FIG. 7, in order to avoid complication, only a p-side electrode pad 42-1A and an n-side electrode pad 44-1A of the light emitting element 10A and a p-side electrode pad 42-2D and an n-side electrode pad 44-2D of the light emitting element 10D are indicated as reference symbols for the electrode pads, and reference symbols for the other electrode pads are omitted.

As illustrated in FIG. 7, the light emitting element array 400 includes the four light emitting elements 10A, 10B, 10C, and 10D, in each of which the light emitting portion 50 and the light receiving portion 52 are disposed in a direction that intersects the direction of arrangement of the light emitting elements 10. As described above, the light emitting elements 10A, 10B, 10C, and 10D are singly formed on substrates 402A, 402B, 402C, and 402D, respectively, of GaAs. The light emitting element 10A includes a light screening post 404-1 formed on the substrate 402A. The light emitting element 10B includes a light screening post 404-2 formed on the substrate 402B. The light emitting element 10C includes a light screening post 404-3 formed on the substrate 402C. The light emitting element 10D includes a light screening post 404-4 formed on the substrate 402D. Hereinafter, the light screening posts 404-1, 404-2, 404-3, and 404-4 will be referred to as "light screening posts 404" when referred to collectively. In addition, the substrates 402A, 402B, 402C, and 402D will be referred to as "substrates 402" when referred to collectively.

The light screening post 404 according to the exemplary embodiment is formed integrally with the substrate 402 by etching a semiconductor layer that is common with the light emitting elements 10, by way of example. In addition, the height of the light screening post 404 is generally the same as the height of the mesa M of the light emitting elements 10, by way of example.

The light emitting element array 400 configured as described above is mounted on a mount substrate 406. In the light emitting element array 400 according to the exemplary embodiment, each light emitting element 10 includes the light screening post 404 which surrounds the light emitting element 10 itself.

The light emitting element array 400 according to the exemplary embodiment is constituted of the individual light emitting elements 10A, 10B, 10C, and 10D which include the light screening posts 404.

Fifth Exemplary Embodiment

Figure 8:
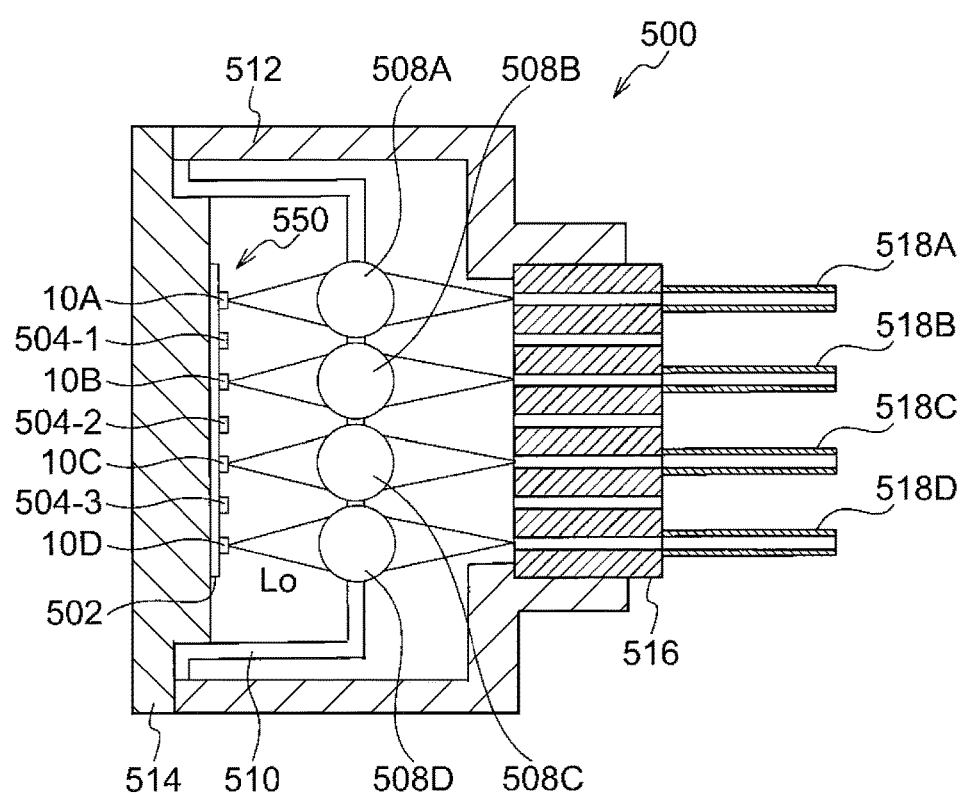
FIG. 8 is a sectional view illustrating an example of the configuration of an optical transmission device according to a fifth exemplary embodiment.

An optical transmission device 500 according to an exemplary embodiment will be described with reference to FIG. 8. FIG. 8 is a sectional view illustrating an example of the configuration of the optical transmission device 500 according to the exemplary embodiment. The optical transmission device 500 is an optical transmission device that uses a light emitting element array 550 of a monolithic type, and is a four-channel optical parallel transmission device. That is, the optical transmission device 500 includes a package that includes a light emitting element array 550 that includes four light emitting elements 10A, 10B, 10C, and 10D monolithically formed on a substrate 502 of GaAs, a stem 514, a cap 10, and a housing 512, and an optical coupling portion that includes a ferrule 516 and optical fibers 518A, 518B, 518C, and 518D (hereinafter "optical fibers 518" when referred to collectively).

As illustrated in FIG. 8, the light emitting element array 550 according to the exemplary embodiment includes a light screening post 504-1 provided between the light emitting element 10A and the light emitting element 10B, a light screening post 504-2 provided between the light emitting element 10B and the light emitting element 10C, and a light screening post 504-3 provided between the light emitting element 10C and the light emitting element 10D (hereinafter referred to as "light screening posts 504 when referred to collectively). More specifically, the configuration of the light emitting element array 550 may be similar to the configuration of the light emitting element array 300 discussed above, for example. Each of the light screening posts 504-1, 504-2, and 504-3 is formed by etching a semiconductor layer that forms the light emitting element 10, by way of example.

The stem 514, which is made of metal, is a base to which the light emitting element array 550 is fixed or mounted using an adhesive or the like, and also serves as a heat sink. Terminals (not illustrated) for power and signals to be fed to the light emitting element array 550 are arranged on a surface of the stem 514 opposite to the surface to which the light emitting element array 550 is mounted.

The cap 510, which is hollow, includes ball lenses 508A, 508B, 508C, and 508D (hereinafter referred to as "ball lenses 508" when referred to collectively) optically coupled to the light emitting elements 10A, 10B, 10C, and 10D, respectively, and has a function of air-tightly sealing the light emitting element array 550. The ball lenses 508 concentrate the emitted light Lo which is emitted from the light emitting elements 10, and couple the emitted light Lo to the corresponding optical fibers 518. The lenses for concentration are not limited to ball lenses, and other lenses such as double-convex lenses and plano-convex lenses may also be used.

The housing 512, which is cylindrical, is fixed to the stem 514, and covers the stem 514 and the cap 510. The ferrule 516, which is quadruple and to which the optical fibers 518 are inserted, is supported at one end of the housing 512.

In the optical transmission device 500 configured as described above, the light emitting element array 550 is modulated (driven) when a current from an external power source is supplied via power terminals arranged on the outer side of the stem 514 and a modulation signal is input from an external drive unit via signal terminals. When the light emitting element array 550 is modulated using the modulation signal, the emitted light Lo which has been modulated is emitted from the light emitting elements 10, coupled to the optical fibers 518, and sent out to an external transmission path.

The optical transmission device 500 according to the exemplary embodiment uses the light emitting element array 550 in which the light screening posts 504 which spatially separate the light emitting elements 10 from each other are disposed between the light emitting elements 10.

Sixth Exemplary Embodiment

An optical transmission device 600 according to an exemplary embodiment will be described with reference to FIG. 9. The optical transmission device 600 is obtained by replacing the light emitting element array 550 in the optical transmission device 500 described above with a light emitting element array 650. Thus, components that are similar to those of the optical transmission device 500 are denoted by the same reference numerals to omit detailed description thereof.

Figure 9:
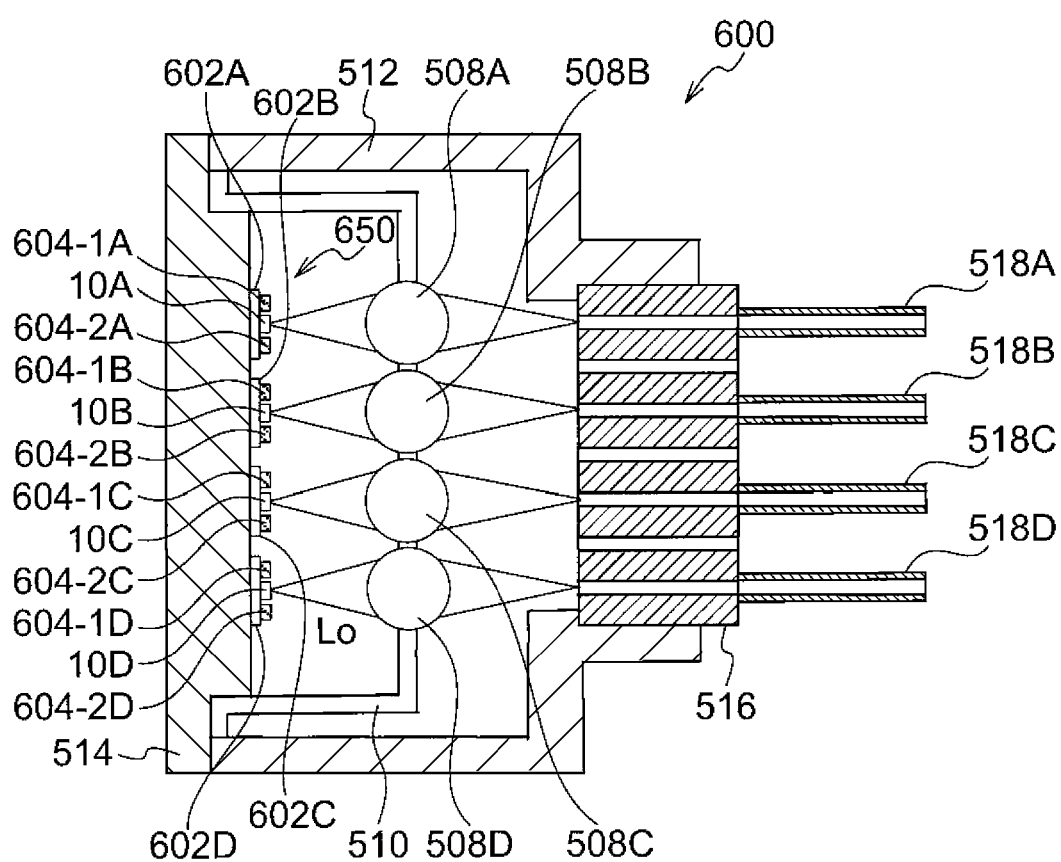
FIG. 9 is a sectional view illustrating an example of the configuration of an optical transmission device according to a sixth exemplary embodiment.

As illustrated in FIG. 9, the light emitting element array 650 according to the exemplary embodiment is constituted by arranging four individual light emitting elements 10A, 10B, 10C, and 10D in a direction determined in advance. That is, the light emitting element 10A is formed on a substrate 602A of GaAs, and light screening posts 604-1A and 604-2A (hereinafter "light screening posts 604" when referred to collectively) are formed on the substrate 602A. The light screening posts 604 are formed by etching a semiconductor layer that is common with the light emitting element 10, by way of example. More specifically, the configuration of the light emitting element array 650 may be similar to the configuration of the light emitting element array 400 discussed above, for example.

Similarly, the light emitting element 10B is formed on a substrate 602B of GaAs, and light screening posts 604-1B and 604-2B are formed on the substrate 602B. The light emitting element 10C is formed on a substrate 602C of GaAs, and light screening posts 604-1C and 604-2C are formed on the substrate 602C. The light emitting element 10D is formed on a substrate 602D of GaAs, and light screening posts 604-1D and 604-2D are formed on the substrate 602D.

The optical transmission device 600 according to the exemplary embodiment uses the light emitting element array 650 in which the light screening posts 604 are disposed between the light emitting elements.

Each of the exemplary embodiments described above uses a linear light emitting element array in which plural light emitting elements are arranged one-dimensionally. However, the present invention is not limited thereto. For example, a light emitting element array in which light emitting elements are arranged two-dimensionally may also be used in accordance with the usage etc. of high optical output power or the like.

In each of the exemplary embodiments described above, the light screening portion or the light screening post is formed by etching a semiconductor layer. However, the present invention is not limited thereto. For example, the light screening portion or the light screening post may be formed using a material, e.g. an opaque resin, that is different from the semiconductor layer which forms the light emitting element array.

In each of the exemplary embodiments described above, a semiconductor layer that has been etched is used, as it is, as the light screening portion or the light screening post. However, the present invention is not limited thereto. A light screening layer may be further formed on the surface of the light screening portion or the light screening post which is formed of a semiconductor layer.

In each of the exemplary embodiments described above, the light emitting elements are spatially separated from each other by a wall-like member to screen light. However, the present invention is not limited thereto. For example, spaces between the light emitting elements may be filled with a member that absorbs light.

In the exemplary embodiments described above, GaAs light emitting elements which use semi-insulating GaAs substrates are used. However, the present invention is not limited thereto. Substrates made from gallium nitride (GaN) or substrates made from indium phosphide (InP) may also be used.

In the exemplary embodiments described above, an n-type contact layer is formed on the substrate. However, the present invention is not limited thereto. A p-type contact layer may be formed on the substrate. In such a case, "n-type" and "p-type" in the above description should be interchanged.

In the exemplary embodiments described above, constituent elements in different exemplary embodiments may be combined, replaced, etc. with each other unless any technical contradiction occurs.

What is claimed is:

1. A light emitting element array comprising:
  a plurality of semiconductor stacking structures each including a light emitting portion and a light receiving portion configured to receive light propagated in a lateral direction via a semiconductor layer from the light emitting portion; and
  a light screening wall provided between the plurality of semiconductor stacking structures configured to screen light directed from the light emitting portion of one of the semiconductor stacking structures to the light receiving portion of another semiconductor stacking structure,
  wherein the light emitting portion comprises a lower reflector, an active region, and an upper reflector that are commonly formed with a lower reflector, an active region, and an upper reflector of the light receiving portion, respectively,
  wherein the active region of the light emitting portion and the active region of the light receiving portion are continuously formed without a layer interposed therebetween, and
  wherein the light emitting portion and the light receiving portion are formed as a single mesa structure;
  wherein each of the plurality of semiconductor stacking structures includes a semi-insulating substrate, and
  wherein the light emitting portion, the light receiving portion, an anode electrode pad connected to the light emitting portion, a cathode electrode pad connected to the light emitting portion, an anode electrode pad connected to the light receiving portion, and a cathode electrode pad connected to the light emitting portion are formed on a front surface side of the semi-insulating substrate.

2. The light emitting element array according to claim 1, wherein the light screening wall is constituted of a semiconductor layer that is common with a semiconductor layer that constitutes the plurality of semiconductor stacking structures.

3. The light emitting element array according to claim 1, wherein the active region of the light emitting portion is configured to implement a light emitting function of the light emitting portion, and
  a height of the light screening wall in a stacking direction of the plurality of semiconductor stacking structures is equal to or more than a height of the active region of the light emitting portion in the stacking direction of the plural semiconductor stacking structures.

4. The light emitting element array according to claim 1, wherein a height of the light screening wall in a stacking direction of the plurality of semiconductor stacking structures is equal to or more than half a height of the plurality of semiconductor stacking structures.

5. The light emitting element array according to claim 1, wherein a light screening layer is formed on a surface of the light screening wall.

6. The light emitting element array according to claim 1, wherein the light receiving portion includes a current-voltage conversion unit configured to convert a current generated when the light receiving portion receives the light propagated in the lateral direction into a voltage.

7. The light emitting element array according to claim 1, wherein a length of the light screening wall as viewed in plan is larger than a length of the light emitting portion as viewed in plan or a length of the light receiving portion as viewed in plan.

8. The light emitting element array according to claim 1, wherein a length of the light screening wall as viewed in plan is larger than a total of a length of the light emitting portion as viewed in plan and a length of the light receiving portion as viewed in plan.

9. The light emitting element array according to claim 1, wherein the light screening wall is provided so as to surround each of the plurality of semiconductor stacking structures.

10. An optical transmission device comprising:
the light emitting element array according to claim 1;
a modulation unit configured to modulate light from the plurality of light emitting portions; and
a plurality of optical fibers configured to transmit emitted light modulated by the modulation unit and emitted from each of the plurality of light emitting portions.

11. The light emitting element array according to claim 1, wherein a current interrupting region is formed between the upper reflector of the light emitting portion and the upper reflector of the light receiving portion.

12. The light emitting element array according to claim 1, wherein a height of the light screening wall in a stacking direction of the plurality of semiconductor stacking structures is less than a height of the plurality of semiconductor stacking structures.

13. The light emitting element array according to claim 1, wherein the lower reflector of the light emitting portion comprises a same semiconductor layer as the lower reflector of the light receiving portion,
wherein the active region of the light emitting portion comprises a same semiconductor layer as the active region of the light receiving portion, and
wherein the upper reflector of the light emitting portion comprises a same semiconductor layer as the upper reflector of the light receiving portion.

14. The light emitting element array according to claim 1, wherein the light screening wall is formed in an area other than an area in which the anode electrode pads and the cathode electrode pads are formed.

15. The light emitting element array according to claim 1, wherein the anode electrode pad connected to the light emitting portion, the cathode electrode pad connected to the light emitting portion, the anode electrode pad connected to the light receiving portion, and the cathode electrode pad connected to the light emitting portion are directly formed on the semi-insulating substrate.

16. The light emitting element array according to claim 1, wherein the light emitting portion and the light receiving portion each have a rectangular shape, and
wherein a width of a coupling portion connecting the light emitting portion with the light receiving portion is smaller than widths of remaining portions of the light emitting portion and the light receiving portion.

* * * * *